United States Patent
Sjmaenok et al.

(10) Patent No.: US 7,612,353 B2
(45) Date of Patent: *Nov. 3, 2009

(54) LITHOGRAPHIC APPARATUS, CONTAMINANT TRAP, AND DEVICE MANUFACTURING METHOD

(75) Inventors: Leonid Aizikovitch Sjmaenok, Vaals (NL); Vadim Yevgenyevich Banine, Helmond (NL); Josephus Jacobus Smits, Geldrop (NL); Lambertus Adrianus Van Den Wildenberg, Geldrop (NL); Alexander Alexandrovitch Schmidt, St. Petersburg (RU); Arnoud Cornelis Wassink, Veldhoven (NL); Eric Louis Willem Verpalen, Geldrop (NL); Antonius Johannes Van De Pas, Veldhoven (NL); Paul Peter Anna Antonius Brom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 490 days.

This patent is subject to a terminal disclaimer.

(21) Appl. No.: 11/481,252

(22) Filed: Jul. 6, 2006

(65) Prior Publication Data

US 2007/0018118 A1    Jan. 25, 2007

Related U.S. Application Data

(63) Continuation-in-part of application No. 11/175,036, filed on Jul. 6, 2005, now Pat. No. 7,397,056.

(51) Int. Cl.
*A61N 5/06* (2006.01)
*G01J 3/10* (2006.01)
*H05G 2/00* (2006.01)

(52) U.S. Cl. .................. 250/504 R; 250/492.1; 250/492.2; 250/493.1; 250/503.1; 250/396 R; 250/461.1; 355/30; 378/34; 359/309; 156/345.48; 156/345.5

(58) Field of Classification Search ............. 250/504 R, 250/492.1, 492.2, 493.1, 503.1, 396 R, 461.1; 355/30; 378/34; 359/309; 156/345.48, 345.5
See application file for complete search history.

(56) References Cited

U.S. PATENT DOCUMENTS 4,408,338 A    10/1983    Grobman .................... 378/34

(Continued)

FOREIGN PATENT DOCUMENTS

EP    1 274 287 A1    1/2003

(Continued)

OTHER PUBLICATIONS

European Search Report issued for European Patent Application No. 06076366.1—2222, dated Apr. 24, 2007.

*Primary Examiner*—David A Vanore
*Assistant Examiner*—Meenakshi S Sahu
(74) *Attorney, Agent, or Firm*—Pillsbury Winthrop Shaw Pittman LLP

(57) ABSTRACT

A lithographic apparatus includes a radiation system including a radiation source for the production of a radiation beam, and a contaminant trap arranged in a path of the radiation beam. The contaminant trap includes a plurality of foils or plates defining channels that are arranged substantially parallel to the direction of propagation of said radiation beam. The foils or plates can be oriented substantially radially with respect to an optical axis of the radiation beam. The contaminant trap can be provided with a gas injector which is configured to inject gas at least at two different positions directly into at least one of the channels of the contaminant trap.

19 Claims, 10 Drawing Sheets

U.S. PATENT DOCUMENTS

| | | | |
|---|---|---|---|
| 4,837,794 A | 6/1989 | Riordan et al. | 378/119 |
| 6,359,969 B1 | 3/2002 | Shmaenok | 378/156 |
| 6,459,472 B1 | 10/2002 | De Jager et al. | 355/68 |
| 6,838,684 B2 | 1/2005 | Bakker et al. | 250/492.2 |
| 7,034,308 B2 | 4/2006 | Bakker et al. | 250/370.08 |
| 7,057,190 B2 | 6/2006 | Bakker et al. | 250/492.2 |
| 7,106,832 B2 | 9/2006 | Klunder et al. | 378/156 |
| 7,145,132 B2 | 12/2006 | Bakker et al. | 250/251 |
| 7,307,263 B2 * | 12/2007 | Bakker et al. | 250/492.2 |
| 7,397,056 B2 * | 7/2008 | Sjmaenok et al. | 250/504 R |
| 2003/0071979 A1 | 4/2003 | Visser | 355/30 |
| 2004/0184014 A1 | 9/2004 | Bakker et al. | 355/30 |
| 2006/0012761 A1 | 1/2006 | Bakker et al. | 355/30 |
| 2006/0138348 A1 | 6/2006 | Bakker | 250/492.1 |
| 2006/0138362 A1 | 6/2006 | Bakker et al. | 250/504 |
| 2006/0139604 A1 | 6/2006 | Wassink et al. | 355/67 |
| 2006/0151717 A1 | 7/2006 | Klunder et al. | 250/492.2 |
| 2006/0169929 A1 | 8/2006 | Wassink | 250/504 |
| 2006/0186353 A1 | 8/2006 | Wassink | 250/492.2 |
| 2006/0219958 A1 | 10/2006 | Wassink | 250/504 |
| 2006/0261290 A1 | 11/2006 | Van Herpen et al. | 250/492.2 |
| 2007/0023706 A1 | 2/2007 | Sjmaenok et al. | 250/504 |

FOREIGN PATENT DOCUMENTS

| | | |
|---|---|---|
| EP | 1 389 747 A2 | 2/2004 |
| EP | 1 389 747 A3 | 4/2004 |
| EP | 1 677 149 A1 | 7/2006 |
| EP | 1 677 150 A1 | 7/2006 |
| JP | 9-320792 | 12/1997 |
| JP | 2000-98098 | 4/2000 |
| JP | 2001-57298 | 2/2001 |
| WO | WO 99/42904 | 8/1999 |
| WO | WO 01/37309 A1 | 5/2001 |
| WO | WO 2006/134512 A2 | 12/2006 |

* cited by examiner

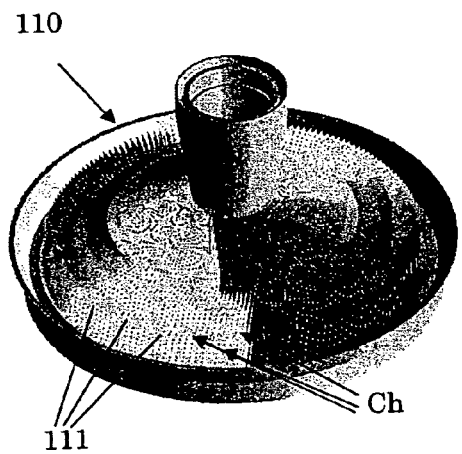
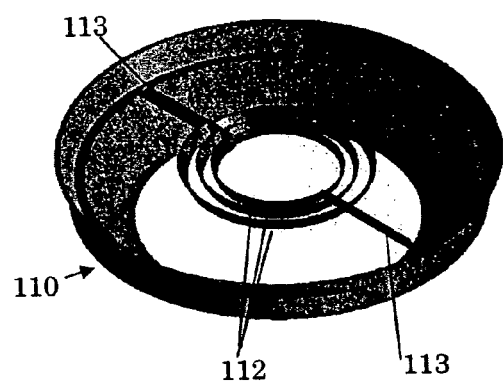
FIG. 9A
FIG. 9B
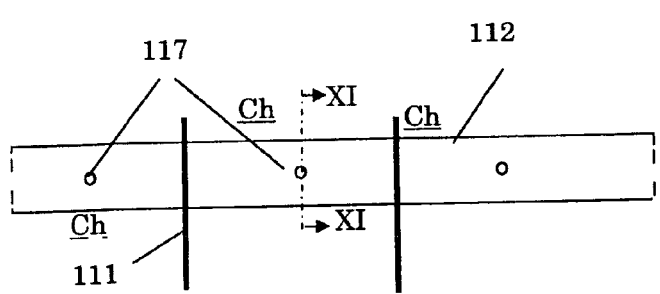
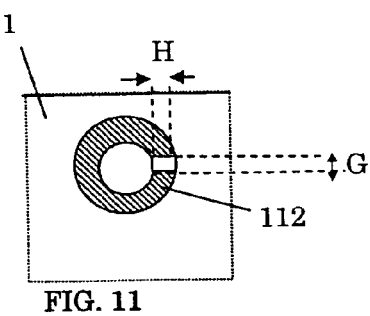
FIG. 10
FIG. 11

LITHOGRAPHIC APPARATUS, CONTAMINANT TRAP, AND DEVICE MANUFACTURING METHOD

CROSS-REFERENCE TO RELATED APPLICATIONS

This application is a continuation-in-part of U.S. patent application Ser. No. 11/175,036, filed on Jul. 6, 2005 now U.S. Pat. No. 7,397,056, the entire content of which is hereby incorporated by reference.

FIELD

The invention relates to a lithographic apparatus, a contaminant trap, a device manufacturing method, and a device manufactured thereby.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

WO99/42904, incorporated herein by reference, discloses a contaminant trap, called a filter, for trapping source debris. Said known contaminant trap comprises a plurality of foils or plates, which may be flat or conical and are arranged in a radial direction from the radiation source. The source, the filter and the projections system may be arranged in a buffer gas, for example krypton, whose pressure is 0.5 Torr. The contaminant particles then take on the temperature of the buffer gas, for example room temperature, thereby sufficiently reducing the particles' velocities before they enter the filter. The pressure in the known contaminant trap is equal to that of its environment. This trap is arranged at 2 cm from the source and its plates have a length, in the propagation direction of the radiation, of at least 1 cm and preferably 7 cm. This design requires relative large and thus costly collecting and guiding/shaping optics to bundle and shape the source radiation and guide it to the mask.

European Patent Application No. 1203899.8 describes a further improved device for trapping debris, such as may be emitted by a plasma source or from resist exposed to EUV radiation. This document describes a contaminant trap comprising a first set of plate members arranged parallel to the direction of propagation of the radiation beam, and a second set of plate members that is arranged parallel to the direction of propagation. The first and second sets are spaced apart from another along an optical axis of the radiation beam. There is a space between the first and second set of plate members. Flushing gas is supplied to that space to provide a high gas pressure to trap the contaminant particles. The two sets of plate members are designed such that leakage of the gas is minimized and that the gas pressure outside the trap is kept low. However, still, an amount of EUV is also absorbed by this gas with relatively high pressure.

SUMMARY

It is an aspect of the present invention to further improve trapping and/or mitigating debris while having a relatively simple design for the contaminant trap.

According to an aspect of the invention, there is provided a lithographic apparatus comprising: a radiation system including a radiation source for the production of a radiation beam; and a contaminant trap arranged in a path of the radiation beam, the contaminant trap comprising a plurality of foils or plates defining channels which are arranged substantially parallel to the direction of propagation of said radiation beam, wherein the contaminant trap is provided with a gas injector which is configured to directly inject gas at least at two different positions into at least one of the channels of the contaminant trap. For example, in an embodiment, the foils or plates can be are oriented substantially radially with respect to an optical axis of the radiation beam. For example, gas can be injected in at least two, at least three, four, or more different positions into a channel.

In an embodiment, a lithographic apparatus is provided. The apparatus includes a radiation system including a radiation source for the production of a radiation beam, and a contaminant trap arranged in a path of the radiation beam. The contaminant trap includes a plurality of foils or plates defining channels arranged substantially parallel to the direction of propagation of said radiation beam. The apparatus also includes a gas injector configured to directly inject gas at least at two different positions into at least one of the channels of the contaminant trap.

In an embodiment, there can be provided a lithographic apparatus comprising: a radiation system including a source for the production of a radiation beam; and a contaminant trap arranged in a path of the radiation beam, the contaminant trap comprising a plurality of foils or plates defining channels which are arranged substantially parallel to the direction of propagation of said radiation beam, wherein the contaminant trap is provided with a gas supply system which is configured to inject gas directly into each of the channels of the contaminant trap. The gas supply system can then be configured to achieve:

$$\int_{x1}^{x2} p(x)dx > 1(Pa \cdot m)$$

in each of the channels, wherein p(x) is the pressure—in Pa—at location x in the channel, x1 is the position—in m—of the entrance of the channel and x2 is the position—in m—of the gas outflow opening(s) in the channel.

Also, in an embodiment, there is provided a contaminant trap, configured to be arranged in a path of a radiation beam during use, the contaminant trap comprising a plurality of foils or plates defining radiation transmission channels which substantially transmit the radiation beam during use, wherein the contaminant trap is provided with a gas supply system which is arranged to inject gas directly at least at two different locations into at least one of the channels of the contaminant trap. For example, there can be provided a contaminant trap, which is configured to be arranged in a path of a radiation beam during use, the trap comprising a plurality of foils or plates defining radiation transmission channels which substantially transmit the radiation beam during use, wherein the contaminant trap is provided with a gas supply system which is arranged to inject gas directly at least at two different locations into at least one of the channels of the contaminant trap, wherein the gas supply system is configured to achieve:

$$\int_{x1}^{x2} p(x)dx > 1(Pa \cdot m)$$

in each of the channels, wherein p(x) is the pressure at location x in the channel, x1 is the position of the entrance of the channel and x2 is the position of the gas outflow opening(s) in the channel.

Also, according to an embodiment, there can be provided a lithographic apparatus, comprising: a radiation system including a radiation source for the production of a radiation beam, and a contaminant trap arranged in a path of the radiation beam, the contaminant trap comprising a plurality of foils or plates defining channels to substantially transmit said radiation beam, wherein each foil or plate is provided with at least a first section and a second section, the first and second section of a foil or plate extending in different directions with respect to each other and adjoining each other along an intermediate line, wherein a virtual extension of the intermediate line intersects a center of the radiation source.

For example, the first and second section of a foil or plate can include an angle less than 180° with each other, for example an angle of about 170° or less.

In an embodiment, there is provided a lithographic apparatus that includes a radiation system including a radiation source for the production of a radiation beam, and a contaminant trap arranged in a path of the radiation beam. The contaminant trap includes a plurality of foils or plates defining channels to substantially transmit said radiation beam, each foil or plate being provided with at least a first section and a second section, the first and second sections of a foil or plate extending in different directions with respect to each other and adjoining each other along an intermediate line. A virtual extension of the intermediate line intersects a center of the radiation source.

Also, in an embodiment, there is provided a lithographic apparatus, comprising: a radiation system including a radiation source for the production of a radiation beam; and a contaminant trap arranged in a path of the radiation beam, the contaminant trap comprising a plurality of foils or plates defining channels to substantially transmit said radiation beam, wherein the contaminant trap is provided with a gas injector which is configured to directly inject gas at one or more positions into at least one of the channels of the contaminant trap, wherein the gas injector is provided with one or more gas supply tubes, for example gas supply rings or ring sections, extending through the foils or plates, wherein the contamination trap is provided with one or more heat shields configured to shield the one or more gas supply tubes substantially from the radiation beam during use. As an example, in a simple embodiment, each heat shields can be formed from heat shield segments extending from the foils or plates, for example segments bended out of the foils or plates, wherein preferable heat shield segments of neighboring foils or plates overlap each other when viewed in a radiation propagation direction of the radiation beam.

In an embodiment, a lithographic apparatus is provided. The apparatus includes a radiation system including a radiation source for the production of a radiation beam, and a contaminant trap arranged in a path of the radiation beam, the contaminant trap comprising a plurality of foils or plates defining channels to substantially transmit said radiation beam. The apparatus also includes a gas injector configured to directly inject gas at one or more positions into at least one of the channels of the contaminant trap, the gas injector being provided with one or more gas supply tubes extending through the foils or plates. The contaminant trap is provided with one or more heat shields configured to shield the one or more gas supply tubes substantially from the radiation beam.

In an embodiment, there is provided a device manufacturing method that includes projecting a patterned beam of radiation onto a substrate, wherein a source is provided to produce a radiation beam, wherein a contaminant trap is provided in a path of the radiation beam, wherein the contaminant trap comprises a plurality of foils or plates defining radiation transmission channels which substantially transmit said radiation beam, wherein gas can be directly injected at least at two different positions into at least one of the channels of the contaminant trap.

In an embodiment, a device manufacturing method is provided. The method includes projecting a patterned beam of radiation onto a substrate; and injecting gas directly into at least at two different positions of at least one channel of a foil or plate of a contaminant trap.

Further, there is provided a device that is manufactured by an above-mentioned method, or by an above-mentioned apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9A is a perspective view of a second embodiment of a contaminant trap, which includes gas injection rings;

FIG. 9B is a similar view as FIG. 9A, without showing the foils;

FIG. 10 is a side view of a detail of a gas supply ring of the second embodiment of the contaminant trap;

FIG. 11 is a cross-section over line XI-XI of FIG. 10;

DETAILED DESCRIPTION

Figure 1:
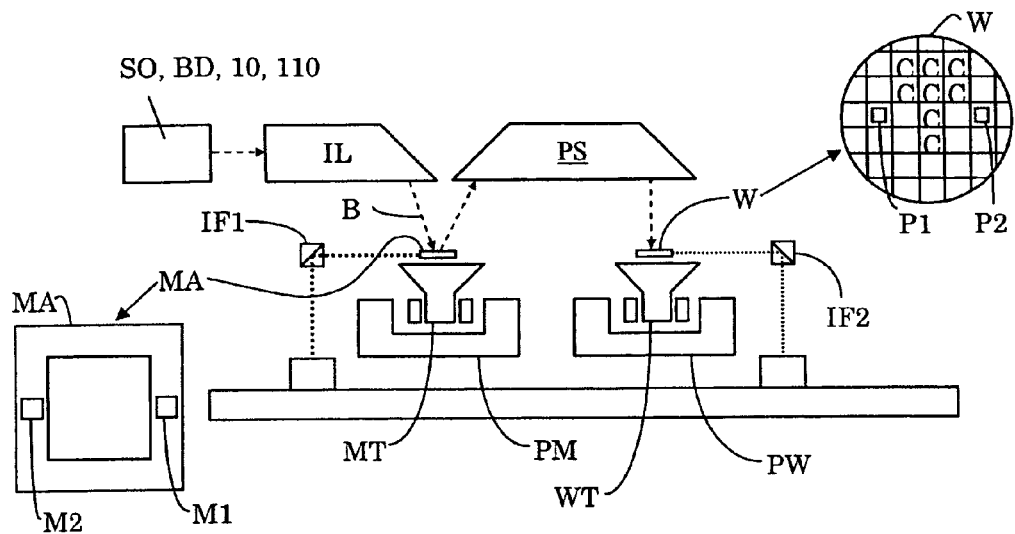
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. Also, a contaminant trap 10, 110, 510 can be provided downstream with respect to the source SO, for example to trap contamination that emanates from the source SO, in particular a radiation source that generates EUV radiation. The source SO and the illuminator IL, together with the beam delivery system BD and/or contaminant trap 10, 110, 510 if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
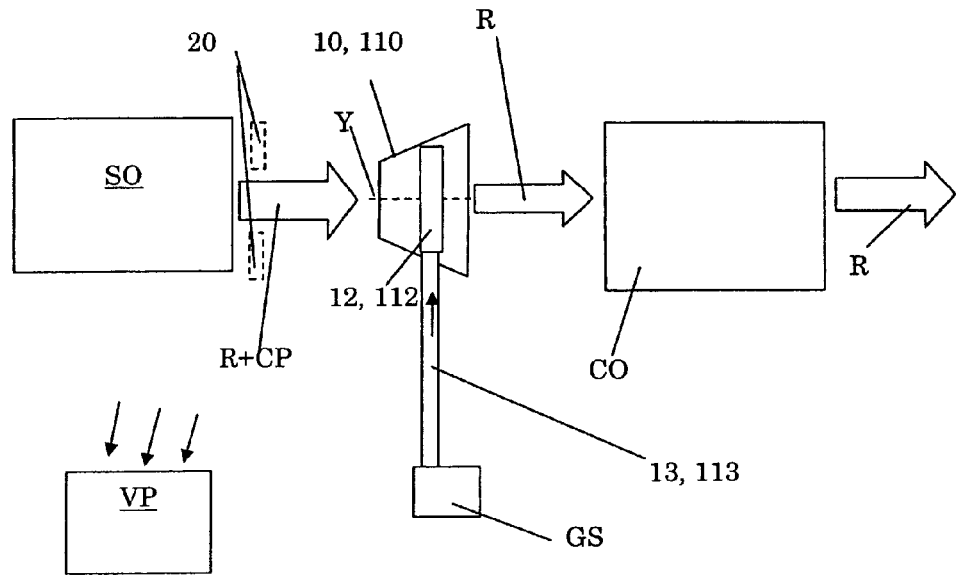
FIG. 2 schematically depicts part of the lithographic apparatus according to a further embodiment of the invention.
Figure 3A:
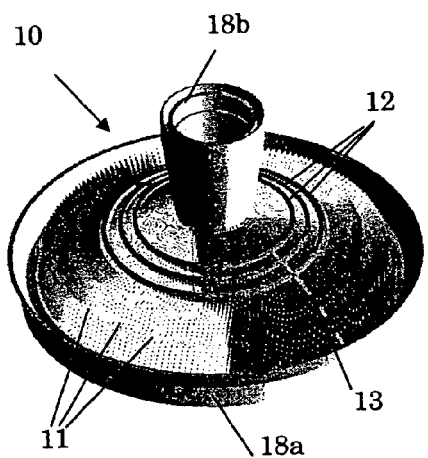
FIG. 3A is a perspective view of a first embodiment of a contaminant trap which includes gas injection capillaries.
Figure 3B:
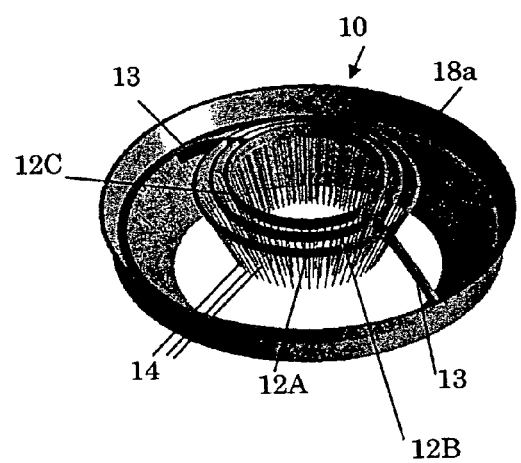
FIG. 3B is a similar view as FIG. 3B, without showing the foils.
Figure 4:
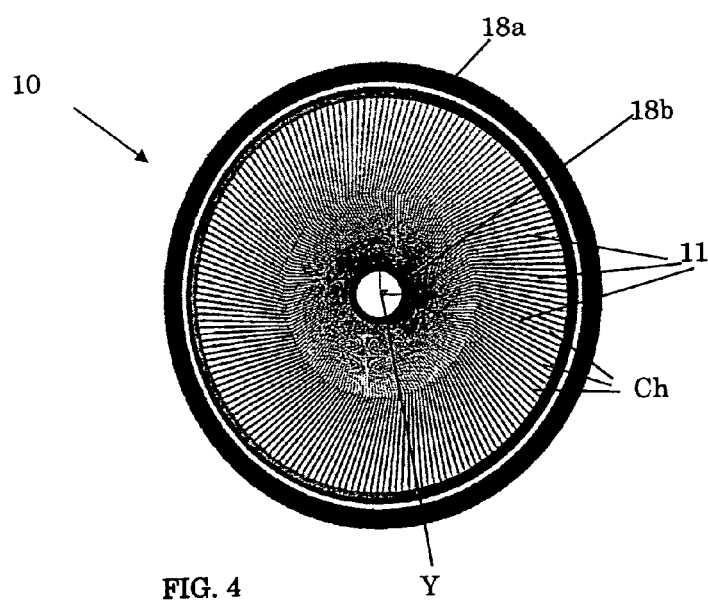
FIG. 4 is a front view of the first embodiment of the contaminant trap, without showing the capillaries.

FIG. 2 depicts a portion of a lithographic apparatus according to FIG. 1. FIG. 2 shows in particular an arrangement of a radiation source SO, a contaminant trap 10, 110 and a radiation collector CO. The contaminant trap 10, 110 is located between said radiation source SO and the radiation collector CO. The radiation collector can include, for example, mirror surfaces that receive radiation from the radiation source during use.

As shown schematically, during use, a radiation beam R can originate from source SO and can propagate into the direction of a contaminant trap 10, 110, which is arranged in the path of that radiation beam R. It should be borne in mind that radiation can propagate from the source in various directions, for example in a diverging manner (see FIG. 7). The contaminant trap 10, 110 can include a large number of substantially parallel channels Ch (for example as shown in FIGS. 3-7) which are configured to transmit most of the radiation beam R from the source SO towards the radiation collector CO. Also during use, contaminating particles CP can move from the source SO towards and into the contaminant trap 10, 110. Such contamination can include, for example, ions and/or atoms that can originate from the radiation source SO. It has been found that in operation much less contaminating particles CP leave the contaminant trap 10, 110 in the direction of propagation of the radiation beam R in comparison with the number of contaminating particles entering the contaminant trap 10, 110 in the general direction of propagation of the radiation beam.

In the embodiment of FIG. 2, the lithographic apparatus is provided with a gas supply system GS, 12, 13, 112, 113 which is arranged to inject at least a first gas directly into at least one of the channels of the contaminant trap 10, 110. The gas supply system can include one or more gas sources GS, a gas injector or manifold 12, 112 (see below) to inject the gas directly into the channel, and one or more gas supply lines 13, 113 which couple the gas source GS to the gas injector 12, 112. Such gas supply lines 13, 113 and gas sources GS can be constructed in various ways, as will be clear to the skilled person. In a further aspect, at least a first gas source GS can be provided, which is connectable or connected to the gas injector 12, 112 to supply at least a first gas thereto. For example, the first gas can be argon, or an other suitable gas. Preferably, the gas injector 12, 112 is configured to substantially not obstruct the transmission of radiation that is transmitted from the radiation source SO towards the mirror surfaces of the radiation collector CO during use.

Figure 7:
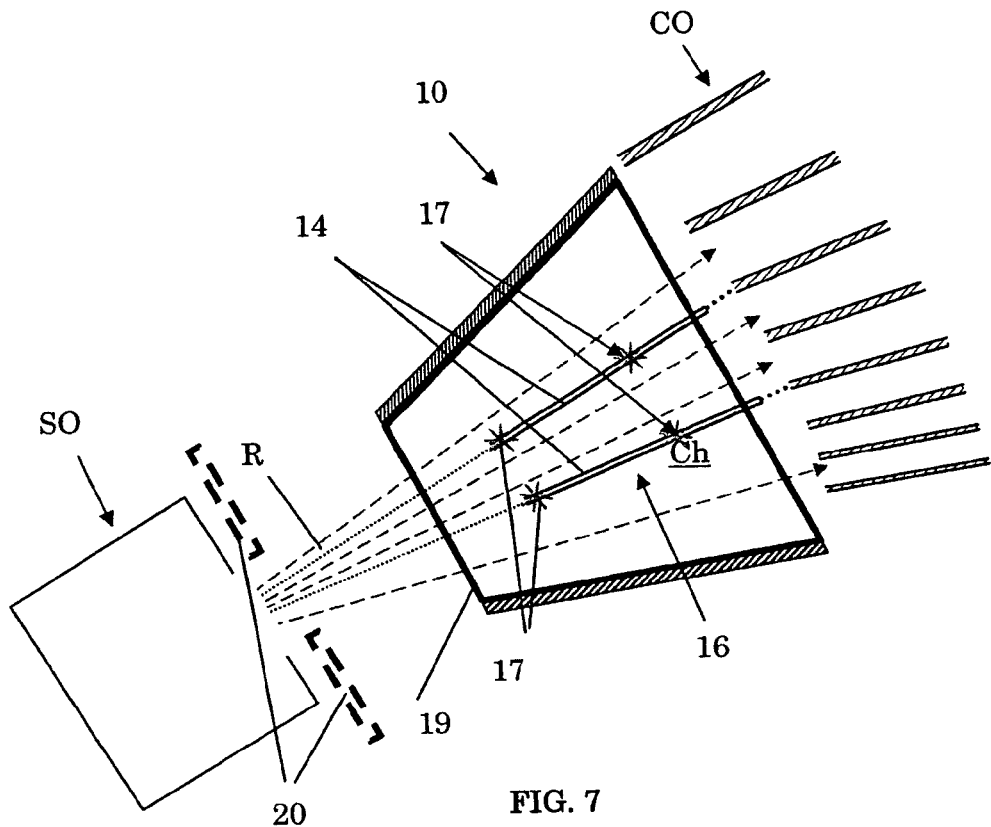
FIG. 7 is a partially opened side view of the first embodiment, showing orientations of two of the capillaries with respect to the source and collector, as well as a number of radiation paths in more detail.
Figure 8:
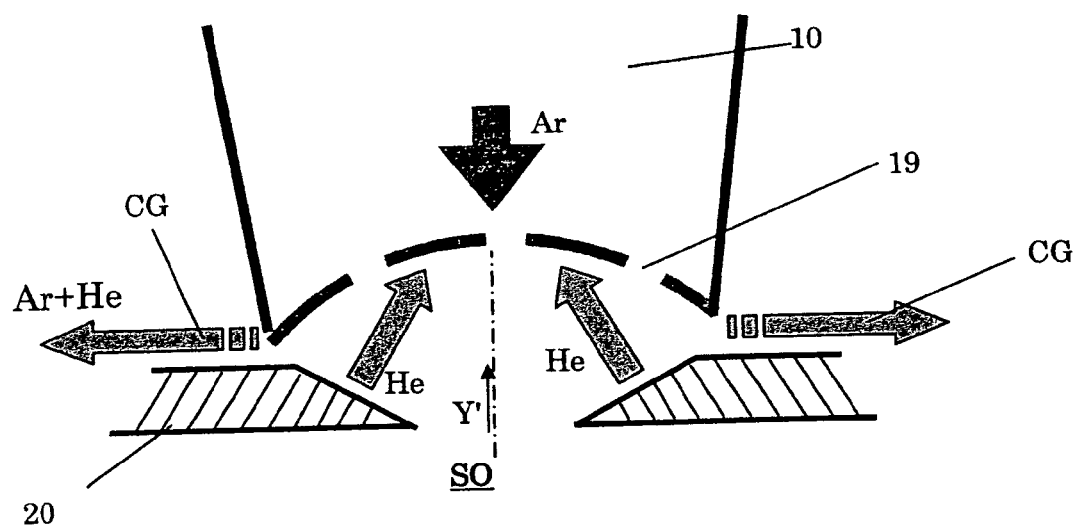
FIG. 8 schematically depicts a detail of the embodiment of FIG. 2, showing an optional helium supplier near opposite sides of the radiation source and the contaminant trap.

Besides, the apparatus can be configured to provide a further gas-flow CG between the source and the contaminant trap 10, 110, which gas-flow CG can flow substantially across the radiation exiting the source SO, in a direction substantially transverse with respect to the direction of propagation of the radiation beam R, or in an other suitable direction. Such further gas flow, or counter gas flow, can counteract or prevent the above-mentioned at least first gas to enter the radiation source SO (see FIG. 8). Also, such further gas flow CG can further capture contamination that emanates from the radiation source. For example, the apparatus can include at least one gas supplier 20 which is configured to inject at least a second gas into a location near a butt-end 19 of the contaminant trap 10, to catch, divert and/or decelerate first gas which flows out of that butt-end 19. Such a gas supplier is schematically depicted in FIGS. 2 and 7 by dashed lines 20. This gas supplier 20 can be configured in various ways. For example, as is shown in FIG. 8, this gas supplier 20 can be mounted onto or form part of a wall portion of the radiation source SO. In an aspect of the invention, the second gas is helium.

Also, the apparatus can be provided with a drain system which is arranged to produce a transverse flow of gas in a radial and outwards direction with respect to the direction of propagation of the radiation beam and along an entrance of the contaminant trap, such that the transverse flow of gas comprises at least part of the injected gas. The drain system can be configured in various ways. For example, the drain system can include one or more vacuum pumps VP that can be configured to pump down the environment of the contaminant trap 10 during use. The drain system can also be configured in a different manner.

FIGS. 3A, 3B, 4-7 show a first embodiment of a contaminant trap 10, that can be used in the above-mentioned lithographic apparatus. This first contaminant trap embodiment 10 comprises a plurality of static foils or plates 11 defining radiation transmission channels Ch. The foils or plates 11 can be substantially solid foils or plates 11 that do not contain apertures by themselves. The channels Ch can be arranged substantially parallel to the direction of propagation of said radiation beam during use, and can extend in substantial radial directions with respect to an optical axis Y of the radiation beam R, or in other directions. Besides, in the present embodiment, the foils or plates 11 are oriented substantially radially with respect to an optical axis Y of the radiation beam R. Also, for example each foil or plate can extend from a radial inner part, or inner contour, of the trap 10 to a radial outer trap part, or outer contour.

The foils or plates 11 can be regularly and symmetrically distributed around the center axis of the trap 10, such that the channels Ch have substantially the same volume. The foils or plates 11 can be connected to each other, for example, at radially outer sides by an outer foil connector 18a. The foils or plates 11 can be connected directly to each other at radially inner sides, or for example, by an inner foil connector 18b. Said foil connectors 18a, 18b can be constructed in various ways, for example as substantially closed or solid cylindrical or truncated conical walls (see FIGS. 3A and 3B), or in a different manner. In the present embodiment, each radiation transmission channel Ch of the contaminant trap 10 is substantially surrounded by neighboring foils or plates 11 and by the outer and inner foil connectors 18a, 18b, when viewed in a transversal cross-section (see also FIG. 4). In an aspect of the invention, the contaminant trap 10 can include a large number of relatively narrow or slit-like channels, for example at least about 100 channels, or at least about 180 channels. In that case, each of the channels Ch can be oriented substantially radially with respect to the optical axis Y of the radiation beam R during use.

The contaminant trap 10 is provided with an above-mentioned gas injector 12 which is configured to directly inject gas at least at two different positions into at least one of the channels Ch of the contaminant trap. In the present embodiment, this gas injector is configured to directly inject gas at least at two different positions into each one of the channels Ch of the contaminant trap 10.

In the embodiment of FIGS. 3A, 3B, 4-7, the gas injector 12 includes three substantially concentric, spaced-apart, ring shaped (circular) gas supply tubes 12A, 12B, 12C, herein also called gas supply rings 12. These gas supply rings 12A, 12B, 12C are also substantially concentric with respect to said optical beam axis Y. Each of these rings 12 is connected to different gas outflow openings which are associated with different channels Ch. To this aim, each of the concentric gas supply rings 12A, 12B, 12C is provided with a plurality of gas injection capillaries 14A, 14B, 14C, or similar thin tubes or gas supply needles. The capillaries (needles) can be used for a controlled supply flow of gas to determined locations of the channels Ch. Each of the gas injection capillaries 14A, 14B, 14C extends into one of the radiation transmission channels Ch (see FIGS. 3B, 5 and 6), such that each of the channels Ch is provided with three of these gas injection capillaries 14 (see FIG. 6). The capillaries 14 can be positioned, for example, along radial directions at "dead" angles. Also, the wall of each of the capillaries 14 can include a plurality of spaced-apart gas outflow openings 17 (see FIG. 5-7).

Figure 5:
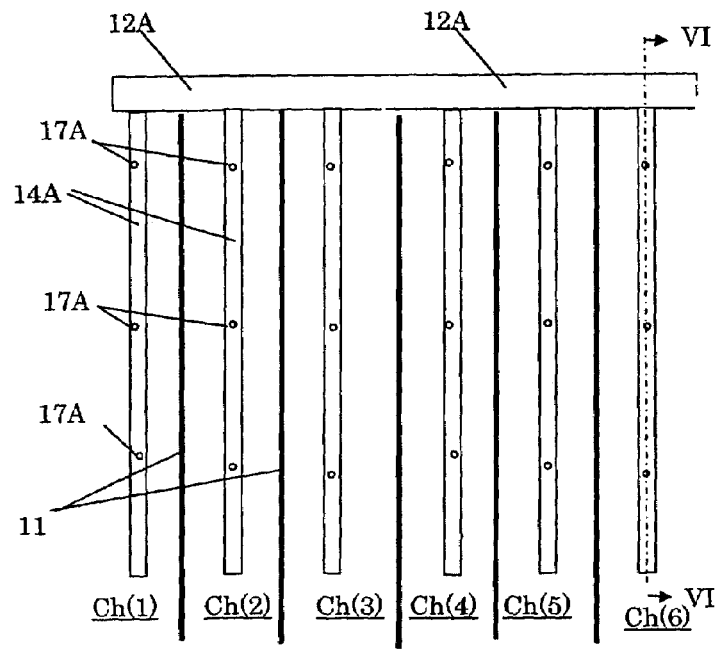
FIG. 5 is a detail of a circumferential cross-section of the first embodiment of the contaminant trap.
Figure 6:
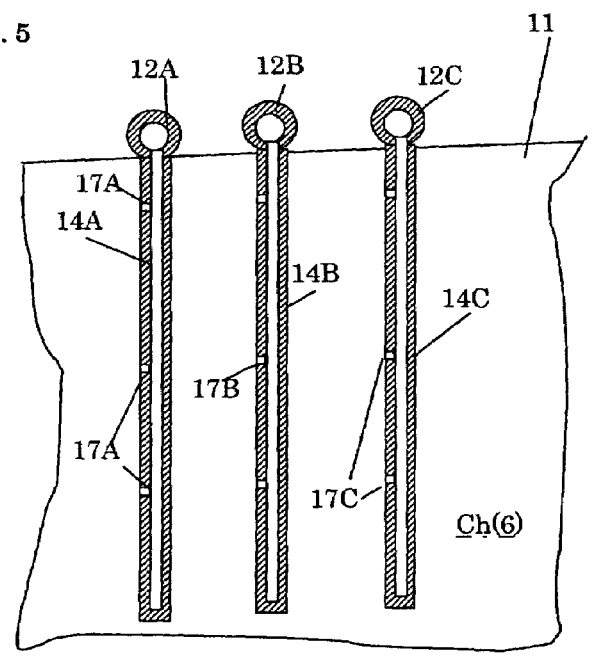
FIG. 6 a cross-section over line VI-VI of FIG. 5.

FIG. 5 shows a detail of a number of neighboring channels Ch(1)-Ch(6), depicting the respective outer capillaries 14A in a front view, and FIG. 6 shows a cross-section of one of these channel parts Ch(6), depicting the respective group of three capillaries 14A, 14B, 14C that are configured to inject gas into that channel Ch(6). In an embodiment of the invention, a distal end of each capillary 14 can be closed (see FIG. 6). As follows from FIG. 7, the capillaries 14 of the gas injector 12 are configured to substantially not obstruct transmission of radiation from the radiation source SO towards the mirror surfaces of the radiation collector CO.

Therefore, in the embodiment of FIGS. 3A, 3B, 4-6, the gas injector comprises a plurality of groups of spaced-apart outflow openings, provided by three groups of capillaries 14A, 14B, 14C, wherein each group of spaced-apart outflow openings 17A, 17B, 17C is associated with one of said channels Ch to supply gas to that channel. In the present embodiment, outflow openings 17A, 17B, 17C of each group of spaced-apart outflow openings are located at different radial positions with respect to the optical axis Y of the radiation beam, since the respective capillaries 14A, 14B, 14C extend at different radial positions in the contaminant trap. Besides, the outflow openings of each group of spaced-apart outflow openings can be located at different and/or substantially the same axial positions with respect to the optical axis Y of the radiation beam. Also, the outflow openings of each group of spaced-apart outflow openings can be connected to different gas supply lines 13, via the gas supply rings 12A, 12B, 12C, for example to independently regulate the amounts of gas that are injected via the different outflow openings. On the other hand, the outflow openings of the three groups of spaced-apart outflow openings can be connected to the same gas supply line 13.

The outflow openings 17 of the capillaries 14 can be configured in various ways. In an aspect of the invention, a relatively large number of relatively small outflow openings 17 is provided, to provide a relatively uniform flow of gas in the channels Ch at the same overall amount of gas injected into the trap 10. For example, at least one of the outflow openings 17 can include a supersonic nozzle, which is configured to inject a supersonic gas stream into the respective channel Ch. Alternatively, such supersonic micro-nozzles can be placed directly on edges of the foils or plates 11, or at different locations. Also, the gas injector can be arranged to inject gas in a different direction than a direction of propagation of the radiation beam through the contaminant trap 10. In the present embodiment, the gas injector is arranged to inject gas in substantially transverse directions into the channels Ch, via the gas outflow openings 17 of the capillaries 14. Each of the outflow openings 17 can have, for example, a minimum diameter of about 0.0018 mm+/−0.002 mm, or another diameter. Outflow openings 17 can be manufactured, for example, using laser cutting or a different technique. Preferably, edges of these openings include sharp edges that are free of burrs.

In an embodiment of the invention, the gas supply system can be configured to supply gas into at least one of the channels Ch of the contaminant trap under gas flow choke conditions. In that case, a steady gas injection can be obtained, particularly when gas is injected via a plurality of the outflow openings 17 under choke conditions. Such conditions can be achieved, for example, when the environment pressure of a capillary 14 is about a factor 2 or more lower than inside pressure, particularly when the first gas is argon. Also, a pressure transition through each outflow-opening 17 can be abrupt to achieve a chocking effect. For example, to this aim, the gas supply system can include at least one gas supply tube, or capillary 14, having a wall which includes a plurality of the gas outflow openings 17, wherein a length H of each gas outflow opening 17, measured through the tube wall, is larger than a cross-section or diameter G of that gas outflow opening. This will be explained below with respect to FIG. 11. The dimensions of the capillaries 14 and outflow openings 17 can be designed such, that the resulting gas injector is sufficient rigid to maintain its form at operation temperature, and that the gas injector can resist tension created therein by overpressure.

In an aspect of the invention, the gas injector 12 and the gas supply GS can be configured to achieve:

$$\int_{x1}^{x2} p(x)dx > 1(Pa\cdot m)$$

during use, wherein p(x) is the pressure at location x in the channel, x1 is the position of the entrance for radiation of the channel and x2 is the position of the gas outflow opening(s) in the channel. As is shown in the figures, during use, the entrance of each channel Ch of the contaminant trap can be directed towards the radiation source SO, to receive radiation therefrom. It has been found that when $$\int_{x1}^{x2} p(x)dx > 1(Pa\cdot m),$$

a good contamination trapping can be achieved by the contaminant trap 10, for example to trap one or more high energetic atomic debris components. Besides, since gas can be injected internally into the channels Ch of the contaminant trap 10, the above-mentioned equation can be achieved, wherein the pressure outside the contaminant trap 10 can be kept sufficiently low.

The embodiment of FIGS. 2-8 can be used in a device manufacturing method comprising projecting a patterned beam of radiation onto a substrate, wherein: the source SO is provided to produce a radiation beam; and the contaminant trap 10 is provided in a path of the radiation beam. Then, the foils or plates of the trap 10 are oriented substantially radially with respect to the optical axis of the radiation beam Y, so that the radiation beam can pass through the trap 10 to the collector DB (see FIG. 7). A first gas, for example argon, is directly injected by the injection capillaries 14 at different positions into each of the channels Ch of the contaminant trap 10. In the present embodiment, the first gas is being injected in injection-directions which not necessarily coincide with the radiation propagation direction, but which directions can provide an efficient filling up the channel. The amount of the first gas that is injected into each channel Ch can be such, that it can capture debris emanating from the radiation source SO relatively well. For example, as follows from the above, the gas can be injected such, that the equation $$\int_{x1}^{x2} p(x)dx > 1(Pa\cdot m)$$

(or in simpler terms: that p.d>1 Pa.m) is satisfied in the channel Ch. When argon is used as a first gas, the amount of argon that is injected into each foil trap channel can be, for example, about $10^{-6}$ kg per second or more, or on the other hand for example a lower amount such as about $10^{-6}$ kg per second or less. When the contaminant trap includes a large number of slit-like channels Ch, for example at least 100 channels Ch, the injected first gas can achieve the above-mentioned equation relatively well. After being injected, the first gas can leave the contaminant trap 10 at one or both ends, wherein the pressure outside the contaminant trap 10 can be held at a usually desired low value.

Also, as is shown in FIG. 8, a transverse flow of a second gas CG can be produced in a radial and outwards direction with respect to the general direction of propagation Y' of the radiation beam and along the entrance of the contaminant trap 10, such that the transverse flow of gas comprises at least part of the injected gas. In the present embodiment, the second gas provides a crossing gas flow across the radiation beam and in a direction substantially transverse the direction of propagation of the radiation beam. The second gas can prevent the first gas from entering the radiation source SO. The second gas can be, for example, helium. It has been found, that helium can protect the radiation source SO against the first gas entering the source SO relatively well, wherein the helium can be used at relatively high pressures without negatively affecting the operation of the radiation source SO too much.

During use of the embodiment of FIGS. 2-8, the first gas can be injected at three different radial positions in each of the channels Ch, viewed from the optical axis of the radiation beam, via pluralities of relatively small gas outflow openings 17A, 17B, 17C. Therefore, a relatively large amount of gas can be injected relatively uniformly into the channel Ch. Preferably, the first gas is injected into the channels under choke conditions. For example, to this aim, the gas pressure inside each capillary 14 can be at least twice the gas pressure in the respective channel Ch, downstream of the outflow openings 17.

Filling up the inter-foil gaps or channels Ch using the internal gas supply openings 17 can enable to achieve a value of the pressure integral over the radial distance within the foil trap, p(x)dx, that is sufficient for thermalization and subsequent trapping of the most energetic atomic debris component, for example debris that can essentially contribute in degradation of EUV collection optics. Since gas can be injected directly into the contaminant trap 10, a relatively large p(x)dx pressure integral value can be obtained, wherein an unacceptable rise of pressure outside the contaminant trap 10 can be prevented. This can be advantageous, for example, in an EUV source zone which includes the radiation source SO, where a maximum pressure of argon is 0.5 Pa, particularly when the radiation source is a Sn source. Besides, during use of the present embodiment, the internal gas injection in each channel Ch can generate a gas flow with a high drag force in the narrow inter-foil channels Ch, providing a relatively high pressure therein. Outside the channel Ch, the drag force can disappear, which results in gas acceleration and drop of pressure.

Also, internal injection can provide a relatively high pressure gas fill in the channel, which, due to the drag force (it can essentially increase with pressure) can slowly leak out of the channel.

Additional protection of the radiation source SO from a fraction of the gas flowing out of channels Ch can be performed using the mentioned counter gas CG flow provided by the second gas. This counter gas flow can have a low static pressure and a high velocity to maintain a total counter pressure at a safe distance from the source SO. As a result, a remaining outflow fraction of the first gas can be re-directed to the drain system. Preferably, during use, a maximally admissible pressure integral p(x).dx over the length of the contaminant trap can be achieved, which pressure integral can be limited by a desired amount of radiation transmission of the radiation beam through the contaminant trap 10. Also, preferably, during use, a high contrast of pressure distribution inside and outside the contaminant trap 10 can be achieved, providing a desired low pressure in the source zone that includes the radiation source SO. Besides, an efficient use of gas flow can be obtained.

FIGS. 9A, 9B, 10, 11 depict a second embodiment of a contaminant trap 110, that can also be used, for example, in an above-mentioned lithographic method. The second embodiment 110 differs from the first contaminant trap embodiment 10, in that the gas injector does not include gas injection capillaries.

Figure 12:
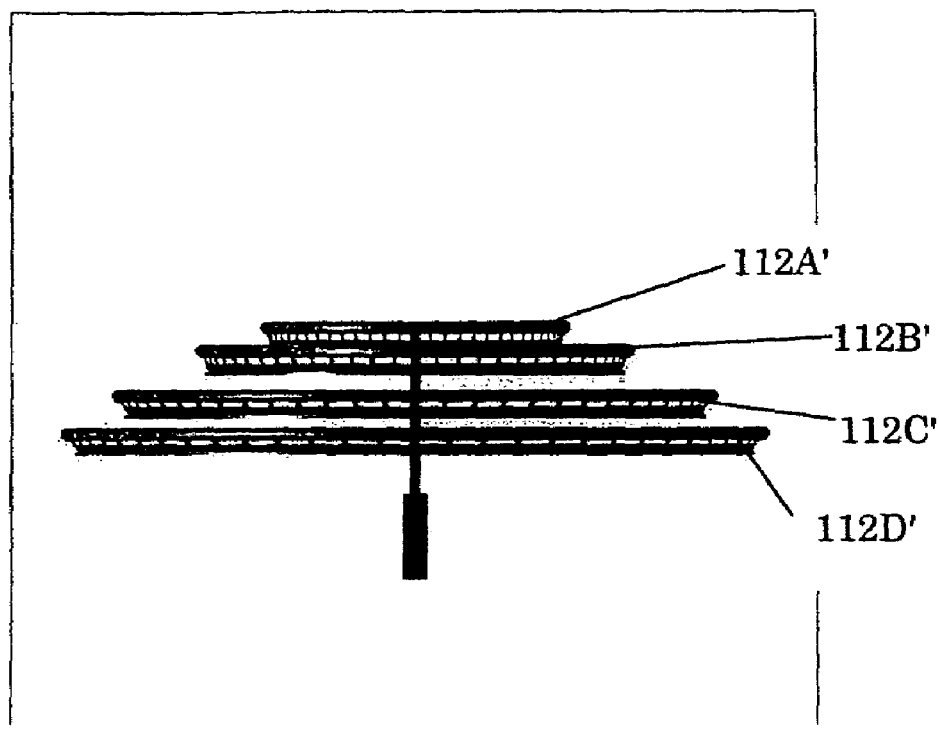
FIG. 12 is a side view of one of the two groups of gas supply ring sections of an alternative gas injector of the second embodiment of the contaminant trap.

In the second embodiment, the gas injector includes three substantially concentric circular gas supply rings 112, wherein each of these rings 112 includes a plurality of the gas outflow openings, as is shown in FIG. 12. The gas supply rings 112 are connected to the above-mentioned gas source GS via one or more gas supply lines 113. The rings 112 are mounted through the foils or plates 111. Also, each of the concentric gas supply rings 112 extends substantially perpendicular through the foils or plates 111. To this aim, the foils or plates 111 can be provided with apertures through which the gas supply rings 112 extend. Each of the gas supply rings 112 includes gas outflow openings 117 to inject gas into respective channels Ch. As is shown in FIG. 11, a length H of each gas outflow opening 117, measured transversally through the tube wall of the respective gas supply ring 112, is larger than a cross-section or diameter G of that gas outflow opening 117. This can lead to choke conditions during use, depending on the pressure drop over the outflow opening, as has been explained above. Also, in the second trap embodiment 110, in each channel Ch the spaced-apart outflow openings 117 are located at different radial positions with respect to the optical axis of the radiation beam Y, to provide a relatively uniform distribution of injected gas.

Figure 13:
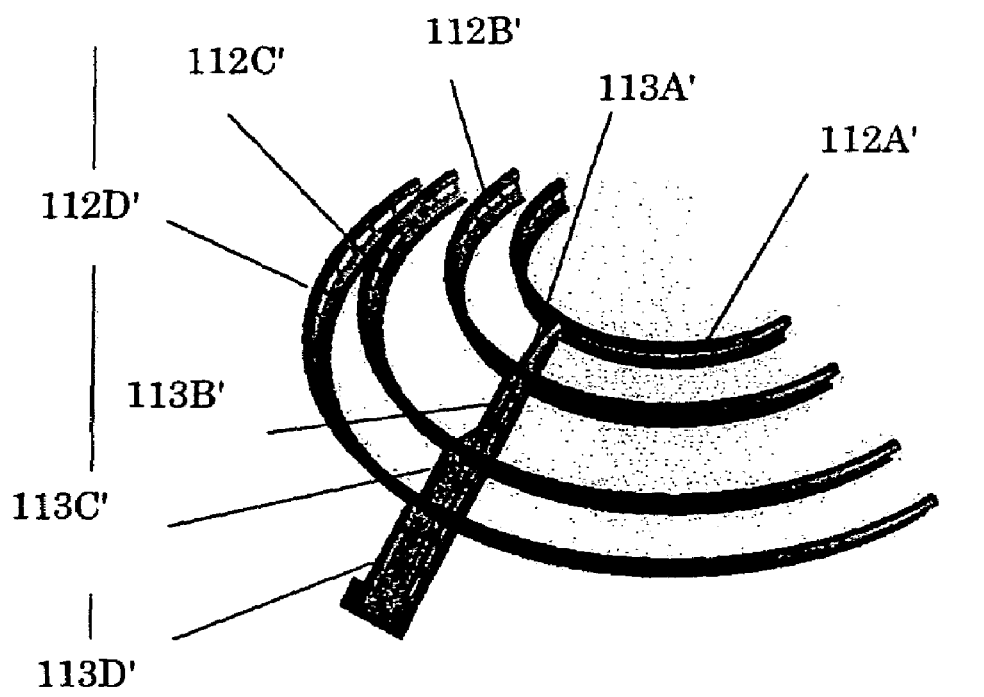
FIG. 13 is a perspective view of the group of ring sections shown in FIG. 12.

FIGS. 12 and 13 show a first part of an alternative embodiment of a gas injector, that can be implemented in the second contaminant trap embodiment 110. In the alternative embodiment of FIGS. 12 and 13, the gas injector includes two sets of four substantially concentric gas supply ring sections 112A', 112B', 112C', 112D'. Only one of the sets is shown. The two separate groups of substantially concentric gas supply ring sections are configured, to form together substantially closed rings, similar to the supply rings 112 of the gas injector as depicted in FIG. 9B. After mounting, each of the concentric gas supply ring sections 112A', 112B', 112C', 112D' extends substantially perpendicular through the foils or plates 111 of the contaminant trap 110. By such a division of the gas injector into two segments, a more simple and straight-forward mounting of the gas injector into the contamination can be obtained.

In the alternative gas injector, each of the gas supply ring sections 112A', 112B', 112C', 112D' comprises spaced-apart gas outflow openings (not shown) which are associated with the different radiation transmission channels Ch to supply gas to these channels Ch. The four gas supply ring sections 112A', 112B', 112C', 112D' of each set of sections are connected to each other by substantially radially extending connecting parts 113. These substantially radially extending connecting parts are provided with four different gas supply lines to supply gas to the different gas ring sections separately. Also, the connecting parts connect the ring sections 112A', 112B', 112C', 112D' of each group of concentric gas supply ring sections 112A', 112B', 112C', 112D' to each other at about their middles, measured along their circumferences (see FIG. 13). This can provide a stable mounting of the ring sections 112A', 112B', 112C', 112D'. The present embodiment of the gas injector can be used to directly inject one or more gasses at least at four different positions into each of the channels Ch of the contaminant trap 110. Since the outflow openings of each group of spaced-apart outflow openings are connected to different gas supply lines 113A, 113B, 113C, 113D, the amounts and/or types of gas that are fed to the different ring sections can be independently regulated, for example using suitable flow controllers and/or gas sources. Such a regulation of gas flows and/or gas types can be directed to optimise the trapping of contamination in the contaminant trap 110, as will be clear to the skilled person.

In FIGS. 12 and 13, the outflow openings of each group of spaced-apart outflow openings are located at different radial positions with respect to the optical axis of the radiation beam (see FIG. 13). Also, the outflow openings of each group of spaced-apart outflow openings are located at different axial positions with respect to the optical axis of the radiation beam (see FIG. 12). Location of spaced-apart outflow openings at different axial positions can enable to achieve optimal injection point to reach large pd integral values.

Figure 14:
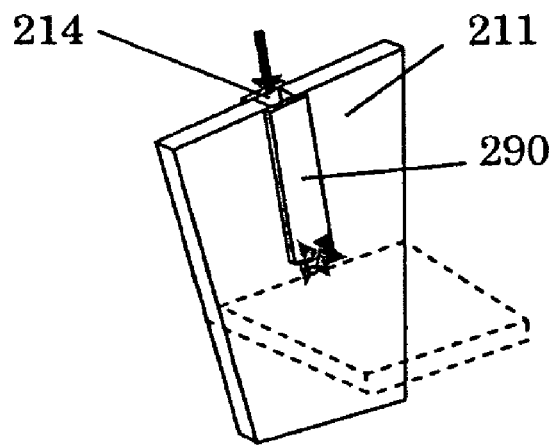
FIG. 14 shows a detail of an alternative embodiment of the invention.

FIG. 14 shows a detail of an embodiment of a contaminant trap. The overall construction of this embodiment can be similar to the construction of one or more of the above-described embodiments of FIGS. 3-13. In the embodiment of FIG. 14, one or more of the gas injection capillaries 214 of the gas injector, or gas supply system, extend within one or more of the foils 211 of the trap to supply gas to selected injection points. Only part of one of the foils 211, which includes one capillary 214, is depicted in FIG. 14. The capillary 214 of the foil 211 can extend to one or more selected injection points or outflow openings (not shown in FIG. 14) to inject gas into one or more adjoining channels of the contaminant trap. The capillary 214 of the foil 211 can be manufactured in various ways, for example by a foil aperture that is covered on both sides by thin foil strips 290.

Figure 15:
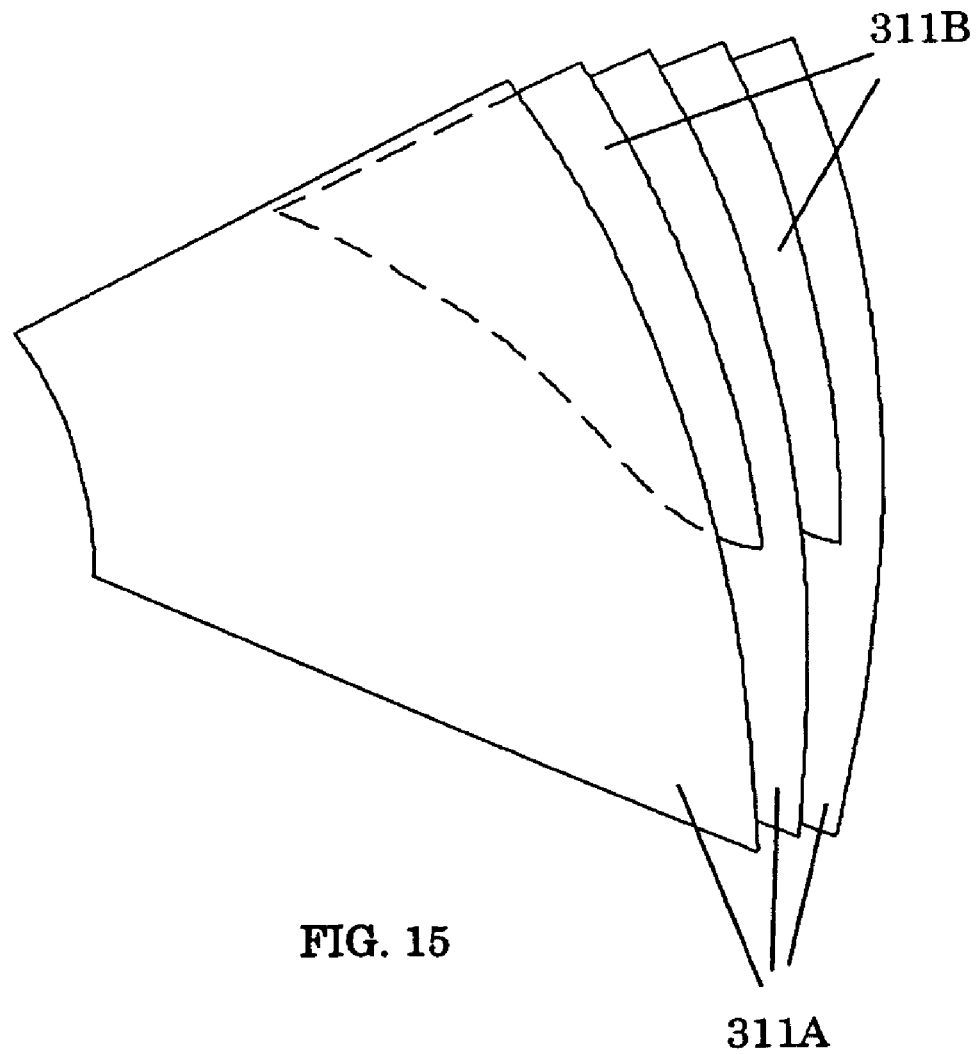
FIG. 15 shows a detail of an embodiment of the invention.

FIG. 15 shows a detail of an embodiment of a contaminant trap. The overall construction of this embodiment can be similar to the construction of one or more of the above-described embodiments of FIGS. 3-14. In the embodiment of FIG. 15, a group of main foils 311A defines the channels, wherein one or more additional foils 311B are installed between the main foils 311A in at least one of the channels. In the embodiment of FIG. 15, one additional radial foil 311B has been installed in each channel. For example, the additional foils can be included in a peripheral zone of the contaminant trap. The additional foil 311B can split the basic inter-foil spaces between the main foils 311A, which can be wide at large distances from the source SO, in two more narrow channels with a higher drag (friction) force for gas, resulting in increase of the pd-integral. The additional foils can be sufficiently remote from the source SO, so that an additional drop of geometrical transparency can be relatively small. As an example only, the size of a mentioned additional foil 311B can be about half the size of a main foil 311A. Also, additional foils of other sizes can be applied. As an example, more than 100 main foils 311A and more than 100 additional foils 311B can be applied.

In the described embodiments of the contaminant trap 10, 110, a controlled uniform gas flow (for example argon) into a number of separated compartments Ch in vacuum environment can be achieved. For example, the uniformity be such that deviations are less than about 10% in argon mass per volume. The contaminant trap 10, 110 can function as a static trap, which—for example—does not rotate with respect to the source. It can function, for example, to "catch" Sn ions and atoms coming from the radiation source, wherein the trap 10, 110 can provide a maximum of radiation transmission. As follows from the above, for not restricting radiation transmission, the gas injector can be designed to substantially extend in the volume which is formed by the "shadow path" of collector shells, and for example of a system of radially positioned mounting elements of the radiation collector.

The contaminant trap 10, 110 can be manufactured in various ways. For example, parts of a mentioned gas injector can be soldered or welded after the soldering or welding of the foils or plates 11. Besides, the gas injector and the foils or plates 11, 111 can be soldered or welded in the same step.

For example, welding or soldering can be used for fine sheet metal parts of the gas injector, with wall thicknesses >0.1 mm. Also, electroforming can be suitable, for example for the case that the wall thickness of the gas supply rings or ring sections are <0.1 mm. By using electroforming, there is freedom in the development of form. Besides, the gas injector can be provided with stiffening ribs, locally varying wall thicknesses or the like, for example to achieve a thinner wall thickness at gas outflow openings for realizing the mentioned choking effect, and for providing a higher wall thickness at global gas injector surface for improved stiffness thereof. Also, different assembly methods can be used.

Besides, due to temperature differences, during normal performance and cleaning procedure, expanding and shrinking effects can be taken into account for dimensioning the gas injector or manifold. For optimal radiation transmission, the gas injection rings or ring sections can be designed in the radiation-path at collector shell positions, such that they do not substantially block more radiation than the collector shells themselves. Preferably, the gas injector is designed such, that a minimum pressure-drop is reached through the gas supply rings 12, 112. Also, the gas injector rings or ring sections can be configured such that during use, thermal expanding and shrinking effects do not consume a certain tolerance budget. For example, during operation, when collector shell and gas injector materials have reached their thermally expanded positions, they are preferably inline with respect to each other, viewed along a radiation transmission direction.

During use, the gas injector can be exposed to relatively high temperatures, for example an estimated environment temperature of 1500K. Therefore, preferably, the material of the gas injector preferably has a high heat resistance. Also, in an embodiment, the gas injector material has sufficient tensile strength at high temperatures, and can be suitable for welding, soldering or electroforming. Further, the material preferably meets a certain outgassing budget.

Figure 16:
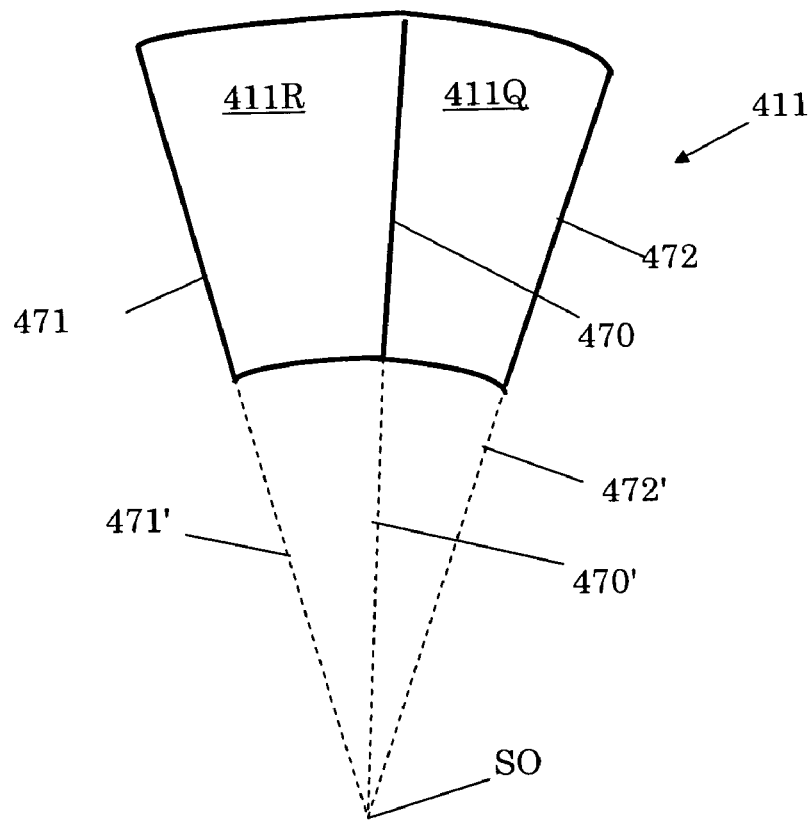
FIG. 16 schematically shows a side view of a foil of a further embodiment of the invention.

FIGS. 16-17 show a foil (or plate) 411 of a further embodiment of a contaminant trap. In this case, the trap can be substantially the same as an above-described contaminant trap, the trap for example comprising a plurality of foils or plates 411 defining the channels which are arranged substantially parallel to the direction of propagation of the radiation beam. For example, the foils or plates can extend along virtual planes, which virtual planes intersect each other substantially in the centre of the radiation source SO during use. For example, the foils or plates 411 may be oriented substantially radially with respect to an optical axis of the radiation beam (or with respect to a centre axis of the trap), or in other directions. For example each foil or plate can extend from a radial inner part, or inner contour, of the trap to a radial outer trap part, or outer contour. For example, the foils or plates 411 can be regularly and symmetrically distributed around the center axis of the trap 10, such that the channels Ch have substantially the same volume. The foils or plates 411 can be connected to each other, for example, at radially outer sides 471 by a suitable outer foil connector 18a. The foils or plates 411 can be connected directly to each other at radially inner sides 472, or for example, by an inner foil connector 18b. In this case, a gas injection system may be provided to inject gas into the channels between the foils 411, however, this is not necessary.

The present foil (or plate) embodiment 411 is provided with a first, outer, section 411Q and a second, inner, section 411R. After assembly, in the present embodiment, the first section 411Q is located radially outwards with respect to the first section 411R. Alternatively, the foil can be provided with more such sections.

The two foil sections 411Q, 411R extend in slightly different directions with respect to each other, and adjoin each other along an intermediate line 470, for example a bending line, or a line which allows a certain pivot movement of the two sections with respect to each other during use. For example, the first and second section of the foil (or plate) 411 can include an angle β less than 180° with each other, for example an angle β of about 170° or less. The angle β is indicated in FIG. 17. For example, the sections 411Q, 411R can be bended over at least about 10° with respect to each other, or over a different (for example smaller) angle. It has been found that a bending angle of at least about 10° (i.e. β≦circa 170°) can provide good results.

Preferably, the foil 411 is simply made in one piece, wherein the foil 411 can be divided into different radial sections by bending the foil along desired bending lines 470.

Preferably, a virtual extension of the intermediate line 470, which extension is indicated by a dashed line 470', intersects a centre of the radiation source SO (also called a "pinch"). Similarly, a virtual extension of an outer edge (or side) 471 of the foil 411 (the extension being indicated by a dashed line 471' in FIG. 16), also intersects the centre of the radiation source SO. In the same way, preferably, a virtual extension of an inner edge (or side) 472, indicated by a dashed line 472', of the foil 411 also intersects the centre of the radiation source SO. As is shown in FIG. 16, in the present embodiment, the mentioned extensions 470', 471', 472' of the intermediate bending line 470, outer foil edge 471 and inner foil edge 472 preferably intersect each other in the same virtual point.

Figures 17A, 17B:
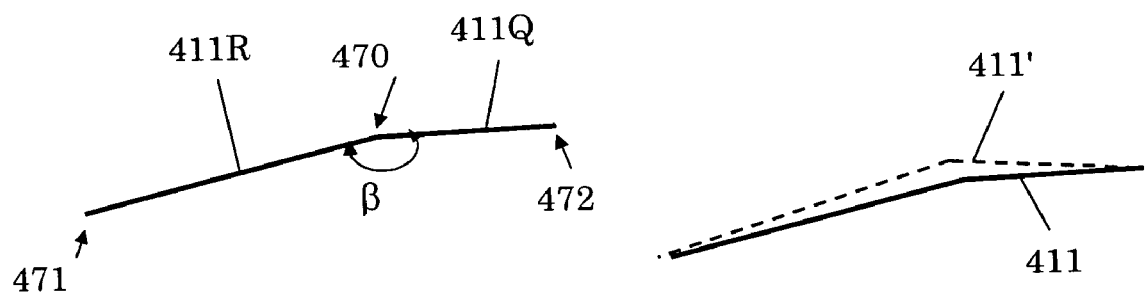
FIG. 17A shows a top view of the foil of FIG. 16.
FIG. 17B is a similar view as FIG. 17A, showing a bending of the foil.
Figure 18:
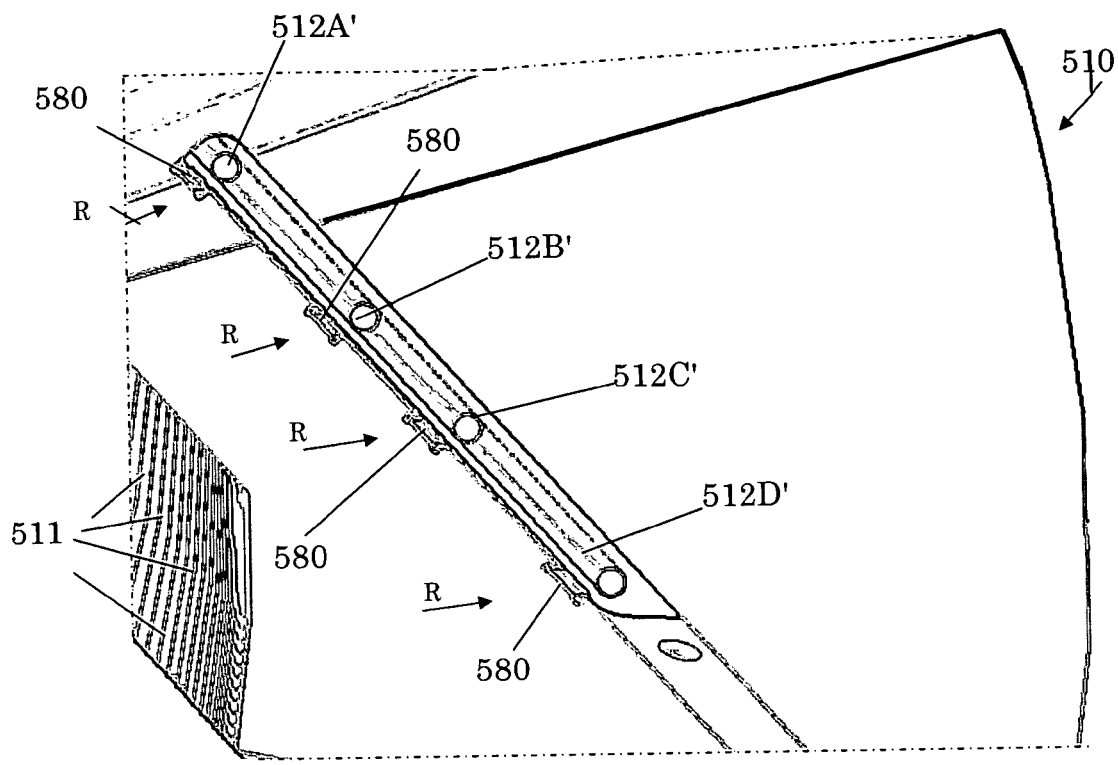
FIG. 18 shows a cross-section of part of a further embodiment, comprising heat shields.

An advantage of the embodiment of FIG. 16-17 is, that thermally induced expansion of the foil 411 (for example due to heat from radiation) can lead to a bending of the foil 411 with respect to the intermediate bending line 470. For example, FIG. 17A shows a first position of the foil 411, wherein no heat induced bending has occurred yet. In FIG. 17B, dashed lines 411' schematically indicate a position of the foil after bending due to expansion of the foil. In this deformed state, the foil still extends substantially longitudinal to the propagation direction of the radiation beam (or: after thermal deformation, the foil still extends along virtual planes, which virtual planes intersect in the centre of the radiation source SO).

In this way, a desired high or maximum radiation transmission through the contaminant trap can be upheld during use, even in case the foils 411 expand due to a heating up, such as during a lithography process.

In the embodiment of FIG. 16-17, to compensate expansion of the foil 411 through heating, there is chosen to bend the foil 411, particularly along the intermediate line 470 so that two adjoining foil sections 411Q, 411R are provided. As follows from the above, for not restricting light transmission during use, the two foil sections are both being held inline with the light rays coming from the pinch (the pinch is the origin of the light), i.e. the centre of the radiation source SO. In this way, during expansion of the foil 411, the foil sections can rotate with respect to each other, with the bent-line 470 as rotation axis, to maintain an inline situation of the foil 411. As follows from the above, to realize this, the longitudinal edges 471, 472 of the foil 411 preferably run through the source centre SO (pinch) as midpoint as well. For example, in the present embodiment, the longitudinal edges 471, 472 of the foil 411 can be pivotally fixed to suitable foil connectors 18a, 18b, so that the intermediate bent-line 470 can keep running through the pinch during expansion of the foil 411. The skilled person will appreciate that such a pivotal connection can be obtained in various ways.

FIGS. 18-21 show part of a contaminant trap 510 according to another embodiment. In this case, also, the trap 510 can be substantially the same as an above-described contaminant trap, the trap for example comprising a plurality of foils or plates 511 defining the channels which are arranged substantially parallel to the direction of propagation of the radiation beam. For example, the foils or plates 511 can extend along virtual planes, which virtual planes intersect in the centre of the radiation source SO during use. For example, the foils or plates 511 may be oriented substantially radially with respect to an optical axis of the radiation beam, or in other directions. For example, there can be provided a group of main foils 511 defines the channels, wherein one or more additional foils can be installed between the main foils, as in the embodiment of FIG. 15. Also, for example, the main foils 511 can each be bendable, or be provided with at least two sections as in the embodiment of FIGS. 16-17.

In the embodiment of FIGS. 18-21, the contaminant trap 510 is provided with a gas injector (or manifold) which is configured to directly inject gas at several more positions into the channels of the contaminant trap 510. The gas injector can be provided with one or more gas supply tubes 512A', 512B', 512C', 512D'. In the present embodiment, gas supply rings or ring sections 512 (see for example the embodiment of FIG. 9-13), extend through the foils or plates 511. In the cross-section shown in FIG. 18, four ring sections 512A', 512B', 512C', 512D' as visible. For example, each tube 512 can be configured to inject gas into a trap channel in a direction towards the radiation source SO, in an opposite direction away from the radiation source SO and/or in other directions.

In the embodiment of FIGS. 18-21, the contaminant trap is provided with heat shields 580 configured to substantially shield gas supply tubes 512 from the radiation R of the radiation beam during use. The heat shields can be provided in various ways. The heat shields may be formed from heat shield segments 580 extending from the foils or plates 511. In the present embodiment, these heat shield 580 segments are simply sections bended out of, or emanating from, the foils or plates 511. Moreover, preferably, heat shield segments 580 of neighboring foils or plates 511 overlap each other when viewed in a radiation propagation direction of the radiation beam. Such an overlap is clearly visible in FIG. 21. Also, for example, the heat shields 580 can be spaced-apart from the gas ducts 512 (see FIG. 21).

For example, each heat shield part of a foil (or plate) 511 can extend substantially perpendicularly with respect to a respective foil 511, or in another direction. As follows from FIG. 21, the segments 580 can be slightly tilted with respect to respective normals (not shown) of the respective foils 511, for example, in a direction away from the radiation source (after assembly), or away from the upstream butt-end 19 of the trap. Preferably, the heat shield segments 580 extend at least between the centre of the radiation source SO and respective gas injection ducts 512A', 512B', 512C', 512D', after assembly, such that the heat shield segments provide downstream shadow areas which contain the gas injection ducts 512A', 512B', 512C', 512D'. Also, the heat shield segments 580 preferably allow a mentioned heat induced expansion (and, vise-versa, a contraction) of the foils 511.

Figure 19:
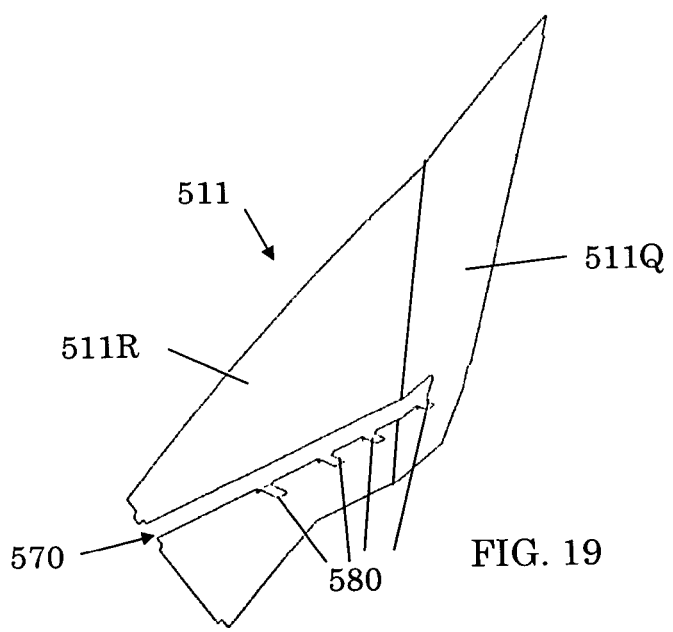
FIG. 19 shows a perspective side view of a foil of the embodiment of FIG. 18.
Figure 20:
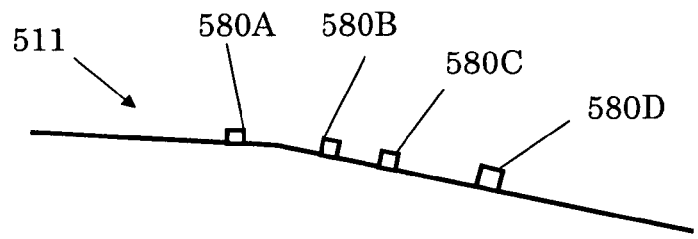
FIG. 20 shows a top view of the foil shown in FIG. 19.
Figure 21:
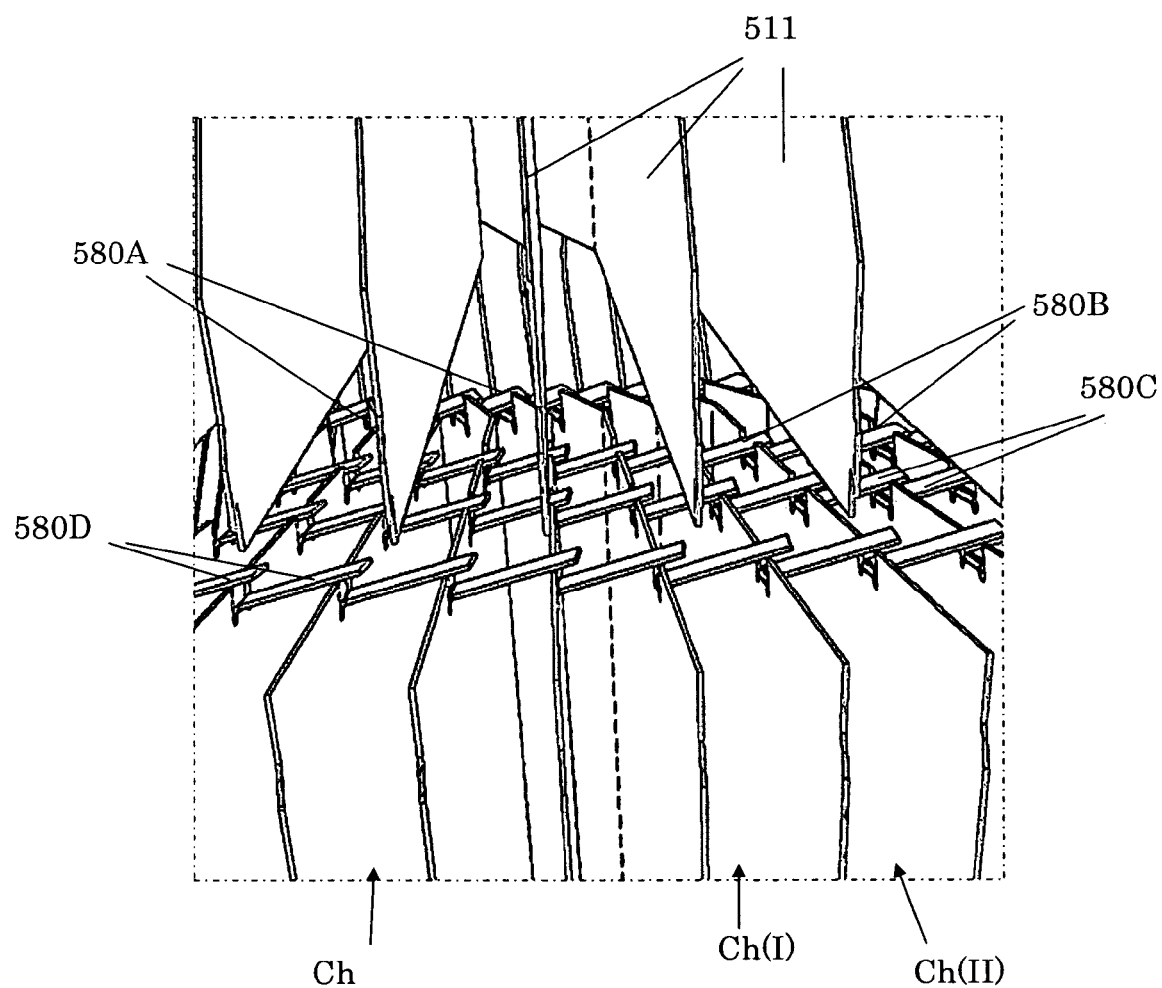
FIG. 21 shows a perspective side view of a detail of the embodiment of FIG. 18, without the gas supply tubes, and particularly shows the overlapping heat shield segments of the foils.

FIGS. 19 and 20 depict an embodiment of a foil of the present contaminant trap, the foil 511 being provided with an aperture 570 or slit, through which the gas supply rings 512 can extend after assembly. Along an edge of the aperture 570, a number of the heat shield segments 580 (four in the present embodiment) may be provided. The segments 580 are preferably integral parts of the foil 511, made in one piece with the foil 511, and are preferably made of the same material as the foil 511. Particularly, each foil 511 is provided with a first heat shield segment 580A, a second shield segment 580B, a third heat shield segment 580C and a fourth heat shield segment 580D. As is shown in FIG. 21, the first heat shield segments 586A of the foils 511 can form an array of such segments after assembly, the array extending in front of a respective gas injection duct 512A' to be shielded. Similarly, arrays of heat shield segments are formed by the second, third and fourth heat shield segments 580B, 580C, 580D of the foils 511, after assembly.

For example, in each array of heat shield segments, the segments 580 are movable with respect of each other to allow a thermally induced expansion of the foils 511, particularly in the case that the foils 511 are provided with above-mentioned bending-lines (as in FIG. 16-17). For example, the segments 580 can overlap without touching each other, in each array of heat shield segments, or the segments 580 can slide with respect to each other in case of thermal related trap deformation.

Also, as follows from FIG. 21, each heat shield segment 580 of a foil 511 preferably reaches through the mentioned aperture 580 of a neighboring foil 511 over a suitable distance, from one channel Ch(I) into a neighboring channel Ch (II), to provide a mentioned overlap. Thus, each heat shield segment 580 has a free end, which reaches into a channel Ch.

The heat shield segments 580 can have various shapes and sizes. For example, the length of the segments 580 can be at least greater than the width of the channels Ch, to bridge the channels Ch, measured at respective circumferential directions of the trap 510. Also, in the present embodiment, the heat shield segments 580 are substantially rectangular, however, different shapes can also be applied.

During use of the contaminant trap 510, a gas flow can be supplied with a certain uniformity over the compartments or channels Ch of the trap. In case no heat shield 580 is applied, the gas manifold 512 may be fully exposed by the radiation R, which may result in a temperature gradient the length of the manifold rings 512. This may result in a changing density of the gas over the length of a manifold ring 512. This may have a negative influence on the uniformity of mass flows over the trap compartments. By applying the heat shields 580, this negative effect on uniformity may be prevented, or at least significantly decreased.

Also, when the heat shields 580 are been heated up and are expanding due to the temperature, they can still maintain a desired shielding the gas injection ring part 512, particularly without introducing mechanical strain onto any referencing part of the contamination trap 510. Also, the heat shields 580 may lead to lower operating temperatures of the gas supply tubes, which simplifies choosing construction material(s). Also, in the present embodiment, by integrating heat shield segments with the foils 511, a simple design and manufacturing of the foils may be provided. In addition, heat may be removed from the heat shield segments 580 in a simple manner, via a respective foil, for example, to a suitable cooling system (not shown) of the contaminant trap (for example, a system comprising cooling water ducts that are thermally coupled to the foils).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

It is to be understood that in the present application, the term "comprising" does not exclude other elements or steps. Also, each of the terms "a" and "an" does not exclude a plurality. Any reference sign(s) in the claims shall not be construed as limiting the scope of the claims.

The descriptions above are intended to be illustrative, not limiting. Thus, it will be apparent to one skilled in the art that modifications may be made to the invention as described without departing from the scope of the claims set out below. For example, additional radial foils with certain optimized configuration, can be installed between main foils in each contaminant trap channel. For example, such additional radial foils can be installed near edges, at a far end of the trap, to increase drag forces and to enable to achieve larger $p(x)dx$ integral values.

What is claimed is:

1. A lithographic apparatus comprising:
   a radiation system including a radiation source for the production of a radiation beam;
   a contaminant trap arranged in a path of the radiation beam, the contaminant trap comprising a plurality of foils or plates defining channels arranged substantially parallel to the direction of propagation of said radiation beam; and
   a gas injector configured to directly inject gas at least at two different positions into at least one of the channels of the contaminant trap.

2. An apparatus according to claim 1, wherein the gas injector comprises a plurality of groups of spaced-apart outflow openings, and
   wherein each group of spaced-apart outflow openings is associated with one of said channels to supply gas to that channel.

3. An apparatus according to claim 2, wherein the gas injector includes a plurality of substantially concentric gas supply rings, or substantially concentric gas supply ring sections, and
   wherein each of the rings or rings sections comprises different gas outflow openings associated with different channels.

4. An apparatus according to claim 3, wherein the gas supply rings or the ring sections are connected to each other by one or more connecting parts, wherein the connecting parts are provided with one or more gas supply lines to supply gas to the gas supply rings or to the ring sections.

5. An apparatus according to claim 3, wherein the gas supply system includes at least two separate groups of substantially concentric gas supply ring sections, said groups together form substantially closed rings.

6. An apparatus according to claim 5, wherein the gas supply system further includes one or more connecting parts which connect the ring sections of each group of substantially concentric gas supply ring sections to each other.

7. An apparatus according to claim 1, wherein the gas injector is configured to supply gas into at least one of the channels of the contaminant trap under gas flow choke conditions.

8. An apparatus according to claim 7, wherein the gas injector includes at least one gas supply tube having a wall which includes a plurality of gas outflow openings, and wherein a length of each gas outflow opening is larger than a cross-section or diameter of that gas outflow opening.

9. An apparatus according to claim 1, further including a gas supply to supply gas to the gas injector, wherein the gas injector and the gas supply are configured to achieve:

$$\int_{x1}^{x2} p(x)dx > 1(Pa \cdot m),$$

during use, and
wherein p(x) is the pressure at location x in the channel, x1 is the position of the entrance of the channel and x2 is the position of a gas outflow opening in the channel.

10. A lithographic apparatus according to claim 1, further comprising:
at least a first gas source configured to be connected to the gas injector to supply at least a first gas thereto, wherein the first gas is argon, and
at least one gas supplier configured to inject at least a second gas into a location near a butt-end of the contaminant trap, to catch, divert and/or decelerate the first gas flowing out of that butt-end, wherein the second gas is helium.

11. An apparatus according to claim 1, wherein a group of main foils or plates defines the channels, and
wherein one or more additional foils or plates are installed between the main foils in at least one of the channels.

12. A lithographic apparatus comprising:
a radiation system including a radiation source for the production of a radiation beam; and
a contaminant trap arranged in a path of the radiation beam, the contaminant trap comprising a plurality of foils or plates defining channels to substantially transmit said radiation beam, each foil or plate being provided with at least a first section and a second section, the first and second sections of a foil or plate extending in different directions with respect to each other and adjoining each other along an intermediate line, wherein a virtual extension of the intermediate line intersects a center of the radiation source.

13. An apparatus according to claim 12, wherein the first and second sections of a foil or plate are oriented an angle of less than 180° with each other.

14. An apparatus according to claim 13, wherein the angle is less than or equal to about 170°.

15. A lithographic apparatus comprising:
a radiation system including a radiation source for the production of a radiation beam;
a contaminant trap arranged in a path of the radiation beam, the contaminant trap comprising a plurality of foils or plates defining channels to substantially transmit said radiation beam; and
a gas injector configured to directly inject gas at one or more positions into at least one of the channels of the contaminant trap, the gas injector being provided with one or more gas supply tubes extending through the foils or plates,
wherein the contaminant trap is provided with one or more heat shields configured to shield the one or more gas supply tubes substantially from the radiation beam.

16. An apparatus according to claim 15, wherein the gas supply tubes are gas supply rings or ring sections.

17. An apparatus according to claim 15, wherein each heat shield is formed from heat shield segments extending from the foils or plates, and wherein heat shield segments of neighbouring foils or plates overlap each other when viewed in a radiation propagation direction of the radiation beam.

18. An apparatus according to claim 17, wherein the heat shield segments bend out of the foils or plates.

19. A device manufacturing method comprising:
projecting a patterned beam of radiation onto a substrate; and
injecting gas directly into at least at two different positions of at least one channel of a foil or plate of a contaminant trap.

* * * * *